(12) United States Patent
Lyu et al.

(10) Patent No.: US 11,853,124 B2
(45) Date of Patent: Dec. 26, 2023

(54) EXPANSION CARD BRACKET MOUNT PANEL

(71) Applicant: Cooler Master Technology Inc., Taipei (TW)

(72) Inventors: Yuqing Lyu, Taipei (TW); Lei Wang, Taipei (TW); Xiao wei Li, Taipei (TW); Hao-yu Chi, Taipei (TW)

(73) Assignee: Cooler Master Technology, Inc., Taipei (TW)

( * ) Notice: Subject to any disclaimer, the term of this patent is extended or adjusted under 35 U.S.C. 154(b) by 0 days.

(21) Appl. No.: 17/965,756

(22) Filed: Oct. 13, 2022

(65) Prior Publication Data
US 2023/0152852 A1   May 18, 2023

(30) Foreign Application Priority Data

Nov. 16, 2021   (CN) .......................... 202111356458.7

(51) Int. Cl.
*G06F 1/16* (2006.01)
*H05K 7/14* (2006.01)

(52) U.S. Cl.
CPC ......... *G06F 1/1632* (2013.01); *H05K 7/1401* (2013.01)

(58) Field of Classification Search
CPC ...................................................... H05K 5/00
See application file for complete search history.

(56) References Cited

U.S. PATENT DOCUMENTS

| 5,673,175 A * | 9/1997 | Carney ................ H05K 7/1429 361/801 |
| 2020/0133354 A1* | 4/2020 | Pena ....................... G06F 1/186 |

\* cited by examiner

*Primary Examiner* — Jerry Wu

(57) ABSTRACT

An expansion card bracket mount panel including an expansion card bracket frame having an interior side, exterior side, and bracket mount component disposed on the interior side, latch component having at least one retaining latch, and retaining pressure component having an elastic pressure contact component is provided. The latch component is rotatably assembled to the exterior side of the expansion card bracket frame having an upward ready position and latched position and the retaining pressure component is rotatably assembled to the latch component having a standby position and retaining position. When the latch component is in the latched position, the latch component is latched to the expansion card bracket frame and a side of the elastic pressure contact component presses flush with the bracket mount component forming a contact force. A reaction force is formed when the elastic pressure contact component deforms when pressed flush with the bracket mount component.

18 Claims, 8 Drawing Sheets

EXPANSION CARD BRACKET MOUNT PANEL

TECHNICAL FIELD

Example embodiments relate generally to the field of electronic component expansion cards and, more particularly, to expansion card bracket mount panels mounted to electronic component chassis' and the insertion and removal of expansion cards to the expansion card bracket mount panels.

BACKGROUND

Demand for faster data transmission and increasing online payment gateway transactions have driven the use of hardware components such as Peripheral Component Interconnect Express (PCIe) cards. PCIe cards is a type of 'expansion card' that connects PCIe devices to a PCIe bus or host chipset, allowing for high bandwidth communication therebetween. PCIe cards can be, for example, video graphic cards, sound cards, small computer system interface (SCSI) cards, Redundant Array of Independent Disks (RAID) expansion cards, Universal Serial Bus (USB) port cards, and television tuner cards.

PCIe cards are typically inserted and retained into compatible slots of an electronic component system such as slots of a host, a server, a network switch, or a computer. Generally, dust covers (or 'slot covers') are first removed from a chassis of the electronic component system. Typically, the covers are attached to the chassis via a fixing screw. After the fixing screw is unscrewed, the dust cover is removed. Next, the PCIe card is aligned with the compatible slot, leveled, and gently but firmly inserted into the slot. Once the PCIe card is seated firmly in place, the fixing screw, previously removed from the chassis, is screwed back into the chassis, retaining a mounting portion of a PCIe card bracket of the PCIe card to the chassis, to prevent the PCIe card from inadvertently detaching from the slot.

Advanced Technology eXtended (ATX) motherboards of the computer, as an example, may have up to four (4) to six (6) slots for video graphic cards, WiFi cards, sound cards, and video capture cards. The four (4) to six (6) PCIe cards must be manually inserted into each slot, whereby each dust cover and screw must be individually extracted, each PCIe card must be individually inserted, and each screw must be individually screwed back to the chassis for retention of the PCIe card to the slot.

The manual extraction of each dust cover and screw and insertion of each PCIe card and screw, individually, is time consuming. The tool required for each extraction and insertion is inconvenient, for example, during sudden failure of the PCIe card and crash of the electronic component system when no tool may be available. Retention of the PCIe card to the chassis in the inside of the electronic component system is cumbersome, given the other electronic components therein, and manipulation of the screw which is small, which may be easily dropped, lost, or stuck in the components of the electronic component system. The wear and tear on the screw threads and/or chassis threads from the unscrewing and screwing of the dust covers and PCIe cards over time may cause failure thereto, such as stripped threading. By not being securely fixed to the slot due to the stripped threading, the PCIe card may inadvertently move, be detached and/or be damaged, causing the electronic component system to crash and fail.

SUMMARY

Various aspects of the present disclosure provide an expansion card bracket mount panel for insertion and removal of expansion cards in an electronic component chassis.

According to one aspect of the present disclosure, an expansion card bracket mount panel including an expansion card bracket frame, a latch component, and a retaining pressure component is provided. The expansion card bracket mount panel is configured to be mounted to an electronic component chassis. The expansion card bracket frame includes an interior side, an exterior side opposite the interior side, and a bracket mount component disposed on the interior side. The expansion card bracket frame is configured to be mounted to the electronic component chassis and for at least one expansion card bracket to be mounted thereto. The bracket mount component includes a first bracket side and a second bracket side opposite the first bracket side. The latch component is rotatably assembled to the expansion card bracket frame on the exterior side. The latch component has an upward ready position and a latched position. The retaining pressure component is rotatably assembled to the latch component. The retaining pressure component has a standby position and a retaining position. When the latch component is in the latched position, the latch component is latched to the expansion card bracket frame and the retaining pressure component is in the retaining position, whereby a side of the retaining pressure component presses flush with the first bracket side.

According to another aspect of the present disclosure, the latch component comprises a latch back side portion and the retaining pressure component comprises a retaining pressure component body. The latch back side portion is rotatably assembled to the expansion card bracket frame via a first shaft. The retaining pressure component body comprises a back side portion. The back side portion is rotatably assembled to the latch component near to the latch back side portion via a second shaft. When the latch component is in the upward ready position, the latch component is perpendicular to the expansion card bracket frame and the retaining pressure component is in the standby position, a distance away from and parallel to the expansion card bracket frame and perpendicular to the latch component. When the latch component is in the latched position, the latch component is parallel to the expansion card bracket frame, the retaining pressure component is flush with and parallel to the expansion card bracket frame, and the retaining pressure component is encompassed within the latch component.

According to yet another aspect of the present disclosure, the retaining pressure component body further comprises a front side portion opposite the back side portion and the retaining pressure component further comprises an elastic pressure contact component disposed on the front side portion. The side of the retaining pressure component pressing flush with the first bracket side when the latch component is in the latched position, is the front side portion with the disposed elastic pressure contact component thereon. When the elastic pressure contact component presses flush with the first bracket side a reaction force is formed.

According to another aspect of the present disclosure, a material of the elastic pressure contact component comprises at least one of a silicone material, or a rubber material, or any combination of the foregoing.

According to yet another aspect of the present disclosure, the expansion card bracket mount panel further comprises a tension spring, the electronic component chassis comprises an opening, and the latch back side portion comprises at least one position latch. The tension spring comprises a first connection end and a second connection end. The opening is configured for mounting of the expansion card bracket mount panel therein and comprises at least one position catch. The at least one position latch corresponds to the at least one position catch. The first connection end is assembled to the expansion card bracket frame and the second connection end is assembled near to the back side portion of the retaining pressure component. A spring force is formed between the expansion card bracket frame and the retaining pressure component. When the latch component is in the upward ready position a frictional force is formed between the at least one position catch and the at least one position latch. The frictional force between the at least one position catch and the at least one position latch is greater than the spring force formed between the expansion card bracket frame and the retaining pressure component, steadily holding the latch component in the upward ready position and the retaining pressure component in the standby position.

According to another aspect of the present disclosure, the latch component further comprises at least one retaining latch opposite the latch back side portion, the second bracket side of the bracket mount component comprises at least one catch disposed thereon, the retaining pressure component body further comprises a pair of side catches, and the opening further comprises a pair of side latches. The at least one retaining latch protrudes from a perimeter side edge of the latch component. The at least one catch corresponds to the at least one retaining latch. The pair of side catches is disposed on bottom opposing sides of the retaining pressure component body, perpendicular to the back side portion. The pair of side latches protrude from opposing perimeter side edges of the opening and correspond to the pair of side catches. When the latch component is in the latched position, the at least one retaining latch is latched to the at least one catch and the pair of side latches is latched to the pair of side catches. A contact force is formed via the at least one retaining latch being latched to the at least one catch and the pair of side latches being latched to the pair of side catches, when the side of the retaining pressure component presses flush with the first bracket side.

According to yet another aspect of the present disclosure, the at least one expansion card bracket comprises a supporting base and a mounting portion. The mounting portion comprises a bottom inner side and a bottom outer side opposite the bottom inner side. The at least one expansion card bracket is mounted to the expansion card bracket frame via at least the mounting portion. When the latch component is in the latched position and the retaining pressure component is in the retaining position, the bottom inner side is flush with the first bracket side, and the retaining pressure component presses flush with the bottom outer side.

According to yet another aspect of the present disclosure, the first bracket side of the bracket mount component further comprises at least one mount guide protruding therefrom, and the mounting portion has guide slot corresponding to the at least one mount guide. When the at least one expansion card bracket is mounted to the expansion card bracket frame, the at least one mount guide protrudes through the guide slot.

According to further yet another aspect of the present disclosure, the at least one expansion card bracket comprises eight expansion card brackets. According to another aspect of the present disclosure, the at least one expansion card bracket comprises at least one of a peripheral component interconnect (PCI), an accelerated graphics port (AGP), or a PCI Express (PCIe), or any combination of the foregoing.

According to one aspect of the present disclosure, an electronic component chassis comprising an expansion card bracket mount panel is provided. The expansion card bracket mount panel includes an expansion card bracket frame, a latch component, and a retaining pressure component. The expansion card bracket mount panel is configured to be mounted to an electronic component chassis. The expansion card bracket frame includes an interior side, an exterior side opposite the interior side, and a bracket mount component disposed on the interior side. The expansion card bracket frame is configured to be mounted to the electronic component chassis and for at least one expansion card bracket to be mounted thereto. The bracket mount component includes a first bracket side and a second bracket side opposite the first bracket side. The latch component is rotatably assembled to the expansion card bracket frame on the exterior side. The latch component has an upward ready position and a latched position. The retaining pressure component is rotatably assembled to the latch component. The retaining pressure component has a standby position and a retaining position. When the latch component is in the latched position, the latch component is latched to the expansion card bracket frame and the retaining pressure component is in the retaining position, whereby a side of the retaining pressure component presses flush with the first bracket side.

According to another aspect of the electronic component chassis of the present disclosure, the latch component comprises a latch back side portion and the retaining pressure component comprises a retaining pressure component body. The latch back side portion is rotatably assembled to the expansion card bracket frame via a first shaft. The retaining pressure component body comprises a back side portion. The back side portion is rotatably assembled to the latch component near to the latch back side portion via a second shaft. When the latch component is in the upward ready position, the latch component is perpendicular to the expansion card bracket frame and the retaining pressure component is in the standby position, a distance away from and parallel to the expansion card bracket frame and perpendicular to the latch component. When the latch component is in the latched position, the latch component is parallel to the expansion card bracket frame, the retaining pressure component is flush with and parallel to the expansion card bracket frame, and the retaining pressure component is encompassed within the latch component.

According to yet another aspect of the electronic component chassis of the present disclosure, the retaining pressure component body further comprises a front side portion opposite the back side portion and the retaining pressure component further comprises an elastic pressure contact component disposed on the front side portion. The side of the retaining pressure component pressing flush with the first bracket side when the latch component is in the latched position, is the front side portion with the disposed elastic pressure contact component thereon. When the elastic pressure contact component presses flush with the first bracket side a reaction force is formed.

According to another aspect of the electronic component chassis of the present disclosure, a material of the elastic pressure contact component comprises at least one of a silicone material, or a rubber material, or any combination of the foregoing.

According to yet another aspect of the electronic component chassis of the present disclosure, the expansion card bracket mount panel further comprises a tension spring, the electronic component chassis comprises an opening, and the latch back side portion comprises at least one position latch. The tension spring comprises a first connection end and a second connection end. The opening is configured for mounting of the expansion card bracket mount panel therein and comprises at least one position catch. The at least one position latch corresponds to the at least one position catch. The first connection end is assembled to the expansion card bracket frame and the second connection end is assembled near to the back side portion of the retaining pressure component. A spring force is formed between the expansion card bracket frame and the retaining pressure component. When the latch component is in the upward ready position a frictional force is formed between the at least one position catch and the at least one position latch. The frictional force between the at least one position catch and the at least one position latch is greater than the spring force formed between the expansion card bracket frame and the retaining pressure component, steadily holding the latch component in the upward ready position and the retaining pressure component in the standby position.

According to another aspect of the electronic component chassis of the present disclosure, the latch component further comprises at least one retaining latch opposite the latch back side portion, the second bracket side of the bracket mount component comprises at least one catch disposed thereon, the retaining pressure component body further comprises a pair of side catches, and the opening further comprises a pair of side latches. The at least one retaining latch protrudes from a perimeter side edge of the latch component. The at least one catch corresponds to the at least one retaining latch. The pair of side catches is disposed on bottom opposing sides of the retaining pressure component body, perpendicular to the back side portion. The pair of side latches protrude from opposing perimeter side edges of the opening and correspond to the pair of side catches. When the latch component is in the latched position, the at least one retaining latch is latched to the at least one catch and the pair of side latches is latched to the pair of side catches. A contact force is formed via the at least one retaining latch being latched to the at least one catch and the pair of side latches being latched to the pair of side catches, when the side of the retaining pressure component presses flush with the first bracket side.

According to yet another aspect of the electronic component chassis of the present disclosure, the at least one expansion card bracket comprises a supporting base and a mounting portion. The mounting portion comprises a bottom inner side and a bottom outer side opposite the bottom inner side. The at least one expansion card bracket is mounted to the expansion card bracket frame via at least the mounting portion. When the latch component is in the latched position and the retaining pressure component is in the retaining position, the bottom inner side is flush with the first bracket side, and the retaining pressure component presses flush with the bottom outer side.

According to yet another aspect of the electronic component chassis of the present disclosure, the first bracket side of the bracket mount component further comprises at least one mount guide protruding therefrom, and the mounting portion has guide slot corresponding to the at least one mount guide. When the at least one expansion card bracket is mounted to the expansion card bracket frame, the at least one mount guide protrudes through the guide slot.

According to further yet another aspect of the electronic component chassis of the present disclosure, the at least one expansion card bracket comprises eight expansion card brackets. According to another aspect of the electronic component chassis of the present disclosure, the at least one expansion card bracket comprises at least one of a peripheral component interconnect (PCI), an accelerated graphics port (AGP), or a PCI Express (PCIe), or any combination of the foregoing.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those of ordinary skill in the relevant art and having the benefit of this disclosure.

DETAILED DESCRIPTION

Figure 1:
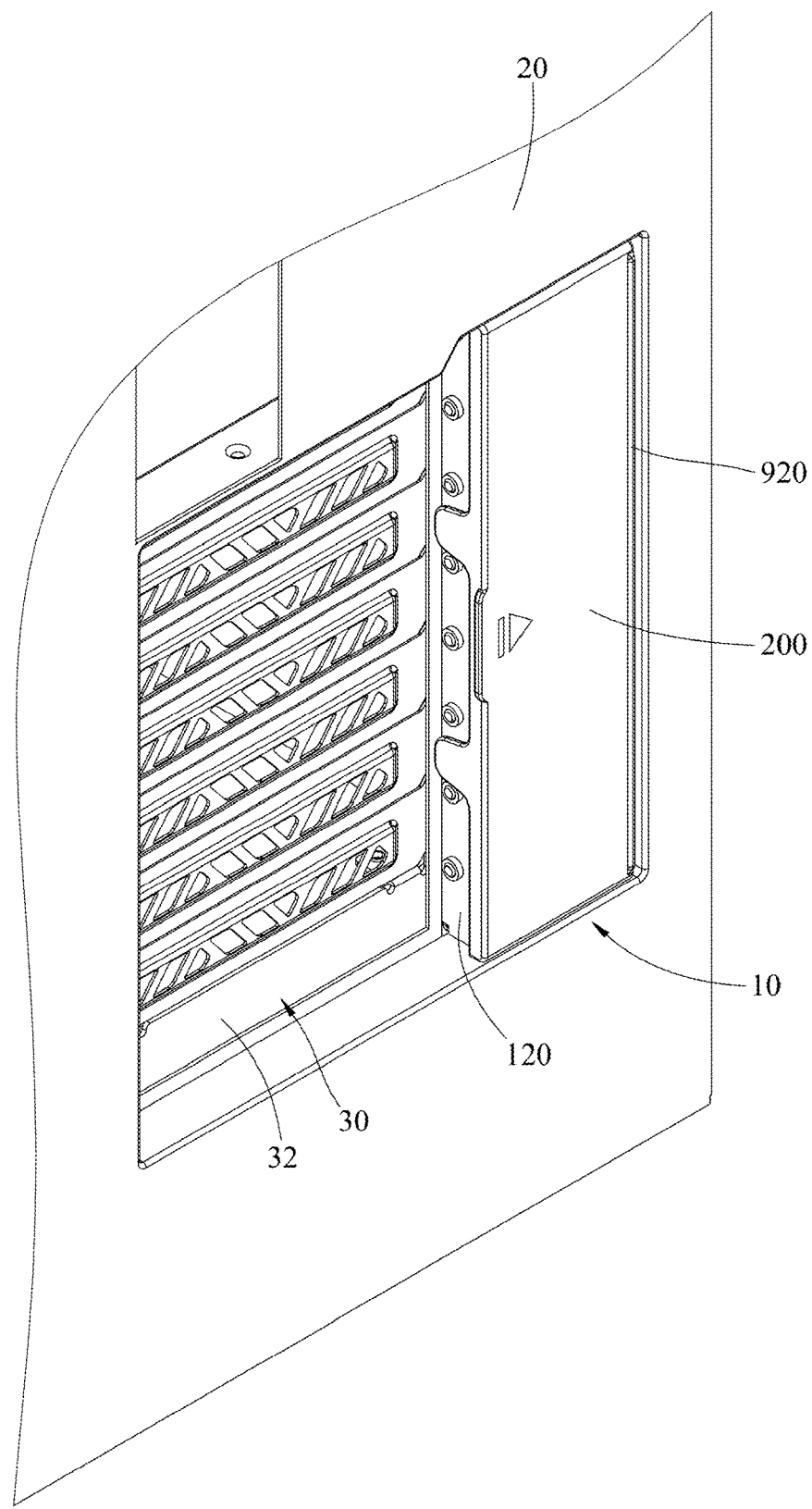
FIG. 1 illustrates a perspective view of an expansion card bracket mount panel in a set position, mounted to an electronic component chassis, according to disclosed embodiments.

The following describes various principles related to electronic component chassis' by way of reference to specific examples of expansion card bracket mount panels, including specific arrangements and examples of expansion card bracket frames, latch components, and retaining pressure components embodying innovative concepts. More particularly, but not exclusively, such innovative principles are described in relation to selected examples of side latches, retaining latches, and elastic pressure contact components and well-known functions or constructions are not described in detail for purposes of succinctness and clarity. Nonetheless, one or more of the disclosed principles can be incorporated in various other embodiments of side latches, retaining latches, and elastic pressure contact components to achieve any of a variety of desired outcomes, characteristics, and/or performance criteria.

Thus, expansion card bracket mount panels having attributes that are different from those specific examples discussed herein can embody one or more of the innovative principles, and can be used in applications not described herein in detail. Accordingly, embodiments not described herein in detail also fall within the scope of this disclosure, as will be appreciated by those of ordinary skill in the relevant art following a review of this disclosure.

In the illustrated embodiments, the electronic component chassis of the electronic component system may be an electronic component chassis of a host, a server, a network switch, or a computer. Additionally, the electronic component chassis may be any electronic component system requiring installation, retention, and extraction of the at least one expansion card bracket therein. In the illustrated embodiments, the at least one expansion card bracket may comprise a supporting base, a mounting portion and a circuit board. The at least one expansion card bracket may be a peripheral component interconnect (PCI) card, an accelerated graphics port (AGP) card, or a PCI Express (PCIe) card. As an example, the PCI card may be any height, version or size. The at least one expansion card bracket may be any expansion card comprising a supporting base, a mounting portion and a circuit board, which may be installed to, retained in, and extracted from an electronic component chassis. For clarity of illustration, the electronic component system is not shown and the electronic component chassis is simplified, and in practice, both may be varied.

Example embodiments as disclosed herein are directed to expansion card bracket mount panels comprising an expansion card bracket frame having an interior side, an exterior side, and a bracket mount component disposed on the interior side, a latch component having at least one retaining latch, and a retaining pressure component having an elastic pressure contact component. The latch component is rotatably assembled to the exterior side of the expansion card bracket frame having an upward ready position and latched position and the retaining pressure component is rotatably assembled to the latch component having a standby position and retaining position. When the latch component is in the latched position, the latch component is latched to the expansion card bracket frame and a side of the elastic pressure contact component presses flush with the bracket mount component forming a contact force. A reaction force is formed when the elastic pressure contact component deforms when pressed flush with the bracket mount component.

Figure 2:
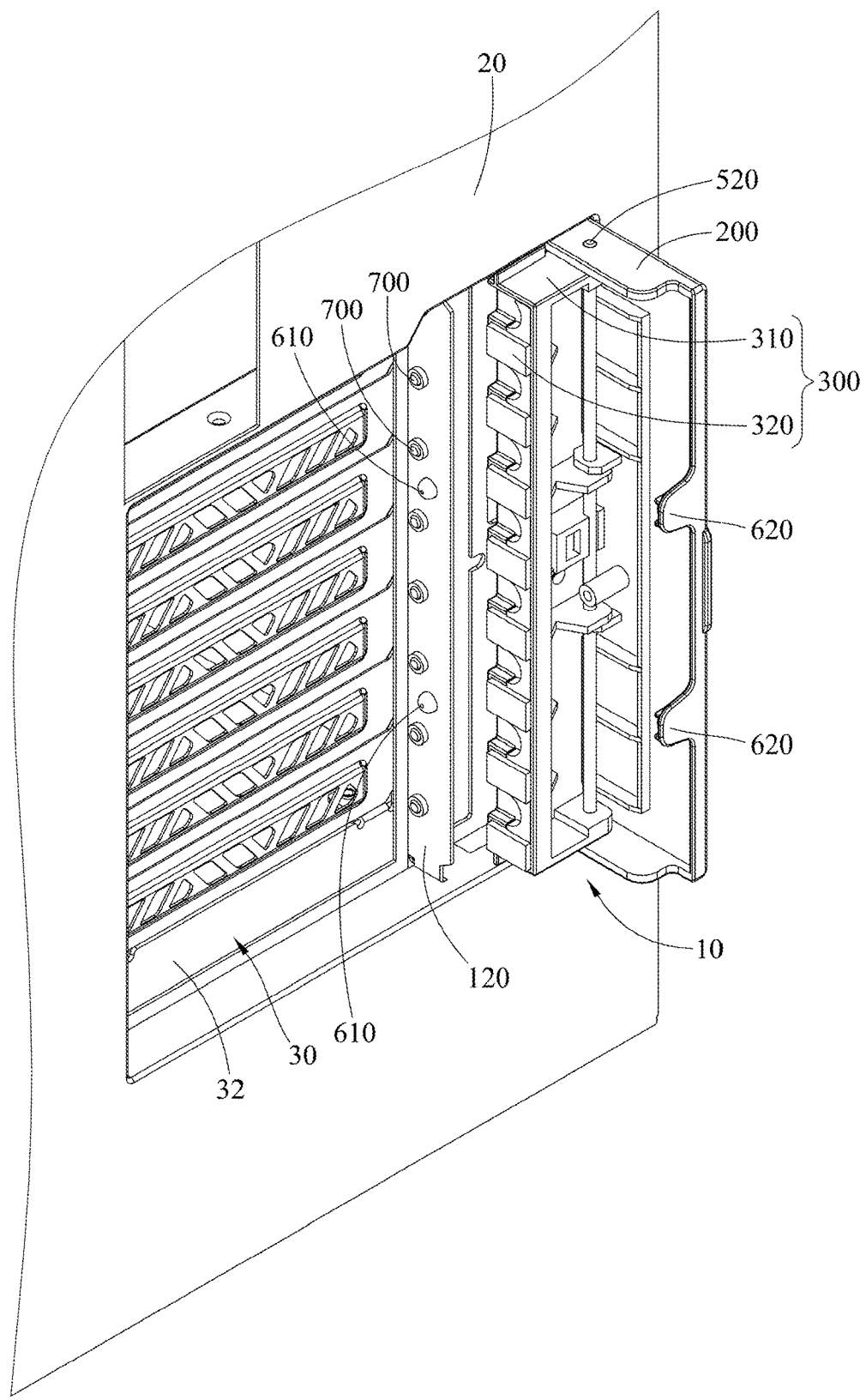
FIG. 2 illustrates another perspective view of the expansion card bracket mount panel of FIG. 1 in another set position, according to disclosed embodiments.
Figure 3:
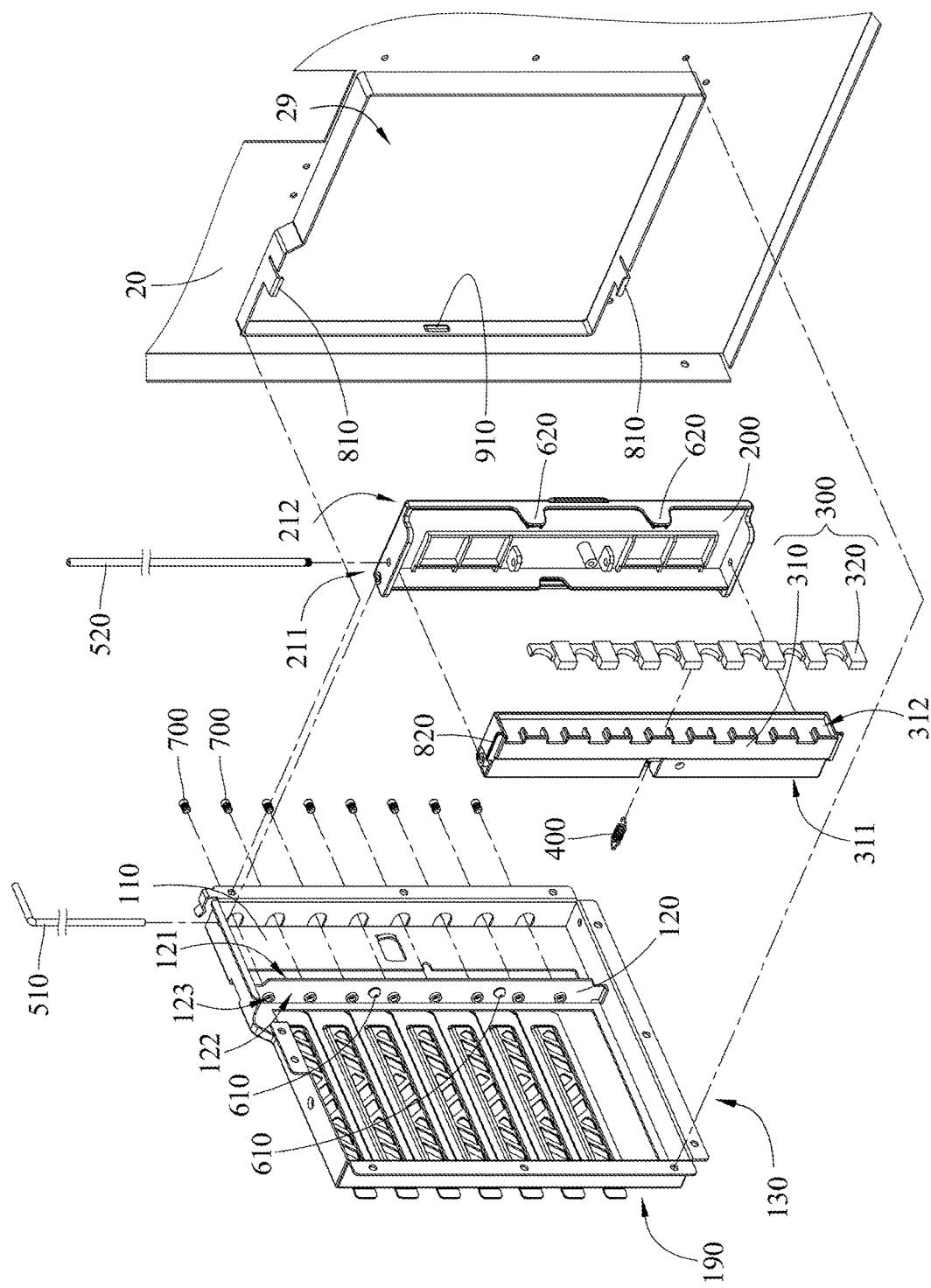
FIG. 3 illustrates an exploded view of the expansion card bracket mount panel of FIG. 1, according to disclosed embodiments.

FIG. 1 illustrates a perspective view of an expansion card bracket mount panel in a set position, mounted to an electronic component chassis, according to disclosed embodiments. FIG. 2 illustrates another perspective view of the expansion card bracket mount panel of FIG. 1 in another set position, according to disclosed embodiments. FIG. 3 illustrates an exploded view of the expansion card bracket mount panel of FIG. 1, according to disclosed embodiments. As illustrated in FIGS. 1-3, an expansion card bracket mount panel 10 including an expansion card bracket frame 100, a latch component 200, and a retaining pressure component 300 is provided. The expansion card bracket mount panel 10 is configured to be mounted to an electronic component chassis 20 (partially shown) and for at least one expansion card bracket 30 to be mounted thereto. In the illustrated embodiments, the expansion card bracket mount panel 10 may be mounted to the electronic component chassis 20 via snap-in fitting, welding, riveting, or other fastening methods known by those of ordinary skill in the relevant art. As illustrated, the expansion card bracket frame 100 is quadrilateral shaped and includes an interior side 190, an exterior side 130 opposite the interior side 190, frame component 110, and a bracket mount component 120 disposed on the interior side 190. As illustrated, the bracket mount component 120 is quadrilateral shaped and includes a first bracket side 121 and a second bracket side 122 opposite the first bracket side 121. As illustrated, the latch component 200 is quadrilateral shaped and rotatably assembled to the expansion card bracket frame 100 on the exterior side 130. The latch component 200 has an upward ready position 290 and a latched position 230. As illustrated, the retaining pressure component 300 is quadrilateral shaped and rotatably assembled to the latch component 200. The retaining pressure component 300 has a standby position 390 and a retaining position 330. When the latch component 200 is in the latched position 230, the latch component 200 is latched to the expansion card bracket frame 100 and the retaining pressure component 300 is in the retaining position 330, whereby a side of the retaining pressure component 300 presses flush with the first bracket side 121 from an exterior of the electronic component chassis 20.

As illustrated, the latch component 200 includes a latch back side portion 211 and the retaining pressure component 300 includes a retaining pressure component body 310. The latch back side portion 211 is rotatably assembled to the expansion card bracket frame 100 via a first shaft 510 (partially shown). The retaining pressure component body 310 includes a back side portion 311. The back side portion 311 is rotatably assembled to the latch component 200 near to the latch back side portion 211 via a second shaft 520 (partially shown). When the latch component 200 is in the upward ready position 290, the latch component 200 is perpendicular to the expansion card bracket frame 100 and the retaining pressure component 300 is in the standby position 390, a distance away and parallel to the expansion card bracket frame 100 and perpendicular to the latch component 200. When the latch component 200 is in the latched position 230, the latch component 200 is parallel to the expansion card bracket frame 100, the retaining pressure component 300 is flush and parallel to the expansion card bracket frame 100, and the retaining pressure component 300 is encompassed within the latch component 200.

As illustrated, the retaining pressure component body 310 further includes a front side portion 312 opposite the back side portion 311. The retaining pressure component 300 further includes an elastic pressure contact component 320 disposed on the front side portion 312. As illustrated, a shape of the elastic pressure contact component 320 is side-by-side column-arch shape. The side-by-side column-arch shape elastic pressure contact component 320 fits correspondingly within the front side portion 312. The side of the retaining pressure component 300 pressing flush with the first bracket side 121 when the latch component 200 is in the latched position 230, is the front side portion 312 with the disposed elastic pressure contact component 320 thereon. Each arch of the elastic pressure contact component 32 corresponds to each of the at least one mount guide 700 of the bracket mount component 120. A material of the elastic pressure contact component 320 includes at least one of a silicone material, or a rubber material, or any combination of the foregoing. When the elastic pressure contact component 320 presses flush with the first bracket side 121 from an exterior of the electronic component chassis 20 a reaction force is formed.

As illustrated, the expansion card bracket mount panel 10 further includes a tension spring 400, the electronic component chassis 20 includes an opening 29, and the latch back side portion 211 includes at least one position latch 920. In the illustrated embodiments, the tension spring 400 may include a helical extension spring, or a device loaded in tension and able to exert a pulling force as well as store energy. The tension spring 400 includes a first connection end 410 and a second connection end 490. As illustrated, the first connection end 410 and the second connection end 490 are hooked ends. As illustrated, the opening 29 is quadrilateral shaped and configured for mounting of the expansion card bracket mount panel 10 therein and includes at least one position catch 910. In the illustrated embodiments, the at least one position catch 910 may be parabolic shaped and integrally formed with the electronic component chassis 20. The at least one position latch 920 corresponds to the at least one position catch 910. As illustrated, a shape of the at least one position catch 910 is parabolic shaped. The first connection end 410 is assembled to the expansion card bracket frame 100 and the second connection end 490 is assembled near to the back side portion 311 of the retaining pressure component 300. A spring force is formed between the expansion card bracket frame 100 and the retaining pressure component 300. When the latch component 200 is in the upward ready position 290 a frictional force is formed between the at least one position catch 910 and the at least one position latch 920. The frictional force between the at least one position catch 910 and the at least one position latch 920 is greater than the spring force formed between the expansion card bracket frame 100 and the retaining pressure component 300, steadily holding the latch component 200 in the upward ready position 290 and the retaining pressure component 300 in the standby position 390.

As illustrated, the latch component 200 further includes at least one retaining latch 620 opposite the latch back side portion 211, the second bracket side 122 of the bracket mount component 120 includes at least one catch 610 disposed thereon, the retaining pressure component body 310 further includes a pair of side catches 820, and the opening 29 further includes a pair of side latches 810. As illustrated, a shape of the at least one retaining latch 620 is semioval shape and the at least one retaining latch 620 protrudes from a perimeter side edge of the latch component 200. As illustrated, the at least one retaining latch 620 includes two at least one retaining latch 620. In the illustrated embodiments, the latch component 200 may be integrally formed. However, the illustrated embodiments are not limited thereto. In further illustrated embodiments, the latch component 200 may be separately formed and then assembled to the latch component 200 thereafter. In the illustrated embodiments, the at least one catch 610 may include a ball rivet, a button head rivet, or any dome-shaped protruding structure or part. The at least one catch 610 corresponds to the at least one retaining latch 620, for example, the at least one catch 610 is convex-shaped and the at least one retaining latch 620 is concave-shaped. However, the illustrated embodiments are not limited thereto. In further illustrated embodiments, the at least one catch 610 may be concave-shaped and the at least one retaining latch 620 may be convex-shaped. As illustrated, the pair of side catches 820 may be rectangular-prism shape and the pair of side catches 820 may be disposed on bottom opposing sides of the retaining pressure component body 310, perpendicular to the back side portion 311. In the illustrated embodiments, the pair of side latches 810 may be integrally formed with the electronic component chassis 20 or be separately formed, and may be made of a different material, for example, plastic, and integrated via, for example, injection molding. As illustrated, a shape of the pair of side latches 810 may be rectangular L-shaped and the pair of side latches 810 may protrude from opposing perimeter side edges of the opening 29 and correspond to the pair of side catches 820.

When the latch component 200 is in the latched position 230, the at least one retaining latch 620 is latched to the at least one catch 610 and the pair of side latches 810 is latched to the pair of side catches 820. A contact force is formed via the at least one retaining latch 620 being latched to the at least one catch 610 and the pair of side latches 810 being latched to the pair of side catches 820, when the side of the retaining pressure component 300 presses flush with the first bracket side 121 from an exterior of the electronic component chassis 20.

Figure 4:
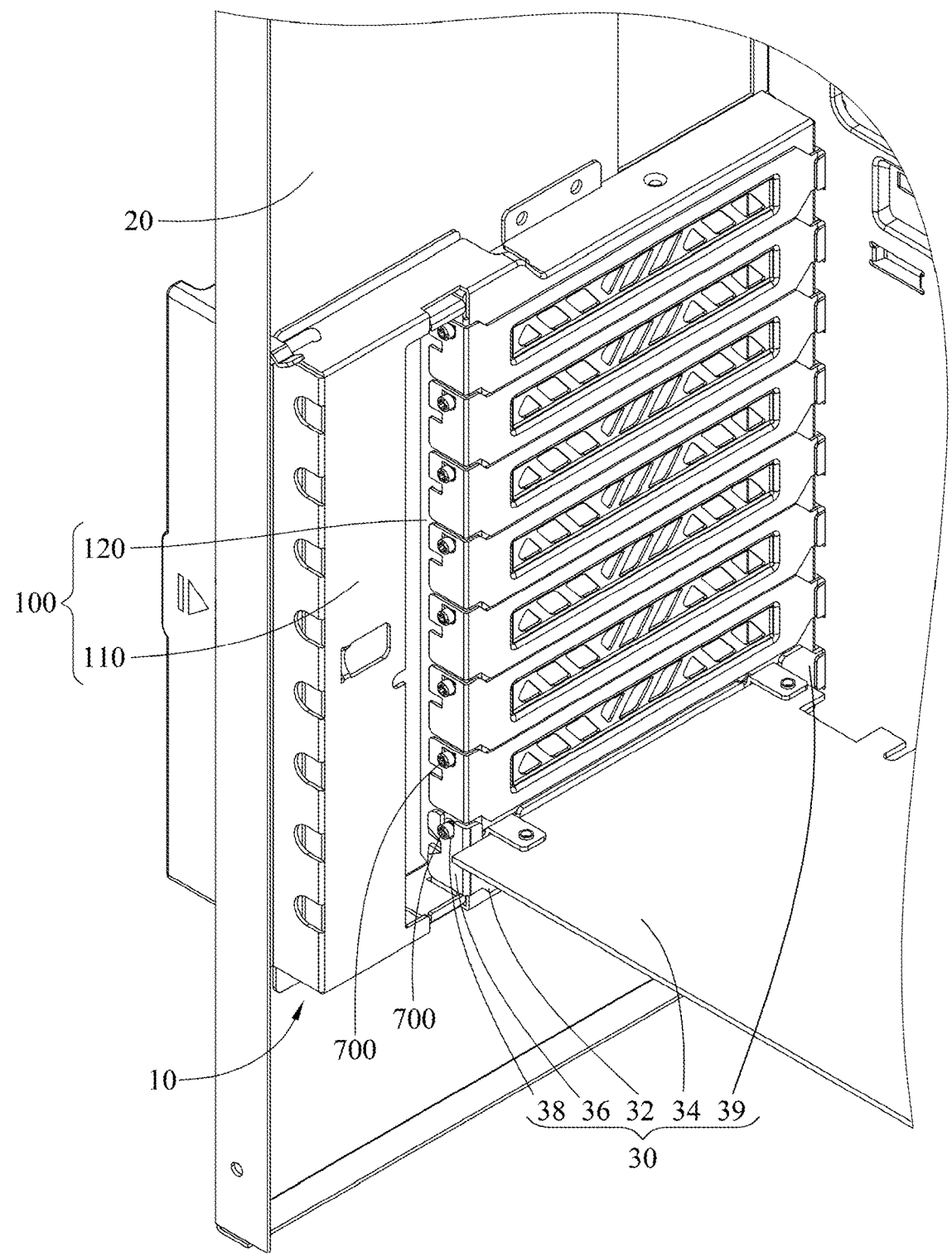
FIG. 4 illustrates a perspective view of the expansion card bracket mount panel of FIG. 2 including an expansion card bracket mounted thereto, according to disclosed embodiments.

FIG. 4 illustrates a perspective view of the expansion card bracket mount panel of FIG. 2 including an expansion card bracket mounted thereto, according to disclosed embodiments. As illustrated in FIG. 4, and as illustrated in FIGS. 1-3, the at least one expansion card bracket 30 includes a supporting base 32 and a mounting portion 36. The mounting portion 36 includes a bottom inner side 132 and a bottom outer side 131 opposite the bottom inner side 132. The at least one expansion card bracket 30 is mounted to the expansion card bracket frame 100 via at least the mounting portion 36. When the latch component 200 is in the latched position 230 and the retaining pressure component 300 is in the retaining position 330, the bottom inner side 132 is flush with the first bracket side 121, and the retaining pressure component 300 presses flush with the bottom outer side 131. As illustrated, the at least one expansion card bracket 30 includes a circuit board 34.

As illustrated, the first bracket side 121 of the bracket mount component 120 further includes at least one mount guide 700 and a through hole 123, and the mounting portion 36 has a guide slot 38 corresponding to the at least one mount guide 700. As illustrated, a shape of the at least one mount guide 700 is cylindrical shape and a shape of the guide slot 38 is semioval shape. The at least one mount guide 700 protrudes through the through hole 123. When the at least one expansion card bracket 30 is mounted to the expansion card bracket frame 100, the at least one mount guide 700 protrudes through the guide slot 38. In the illustrated embodiments, the through hole 123 may be a through hole or be a blind hole. As long as the at least one mount guide 700 protrudes through the guide slot 38. As illustrated, the at least one expansion card bracket 30 further includes a guide end 39 opposite the mounting portion 36 and the electronic component chassis 20 further includes at least one expansion card bracket slot 22 corresponding to the guide end 39. When the at least one expansion card bracket 30 is mounted to the expansion card bracket frame 100, the at least one mount guide 700 protrudes through the guide slot 38 and the guide end 39 protrudes into the at least one expansion card bracket slot 22.

As illustrated, the at least one expansion card bracket 30 includes eight expansion card brackets 30. However, the illustrated embodiments are not limited thereto. In further illustrated embodiments, the at least one expansion card bracket 30 includes less than or greater than eight expansion card brackets 30. As illustrated, the at least one expansion card bracket 30 includes at least one of a peripheral component interconnect (PCI), an accelerated graphics port (AGP), or a PCI Express (PCIe), or any combination of the foregoing.

As illustrated, an electronic component chassis 20 comprising an expansion card bracket mount panel 10 is provided. The expansion card bracket mount panel 10 of FIGS. 1-3 is similar to the expansion card bracket mount panel 10 of the electronic component chassis 20, and thus may be best understood with reference thereto where like numerals designate like components not described again in detail. The expansion card bracket mount panel 10 includes an expansion card bracket frame 100, a latch component 200, and a retaining pressure component 300. The expansion card bracket mount panel 10 is configured to be mounted to an electronic component chassis 20 (partially shown) and for at least one expansion card bracket 30 to be mounted thereto. In the illustrated embodiments, the expansion card bracket mount panel 10 may be mounted to the electronic component chassis 20 via snap-in fitting, welding, riveting, or other fastening methods known by those of ordinary skill in the relevant art. The expansion card bracket frame 100 includes an interior side 190, an exterior side 130 opposite the interior side 190, frame component 110, and a bracket mount component 120 disposed on the interior side 190. The bracket mount component 120 includes a first bracket side 121 and a second bracket side 122 opposite the first bracket side 121. The latch component 200 is rotatably assembled to the expansion card bracket frame 100 on the exterior side 130. The latch component 200 has an upward ready position 290 and a latched position 230. The retaining pressure component 300 is rotatably assembled to the latch component 200. The retaining pressure component 300 has a standby position 390 and a retaining position 330. When the latch component 200 is in the latched position 230, the latch component 200 is latched to the expansion card bracket frame 100 and the retaining pressure component 300 is in the retaining position 330, whereby a side of the retaining pressure component 300 presses flush with the first bracket side 121 from an exterior of the electronic component chassis 20.

As illustrated for the electronic component chassis 20, the latch component 200 includes a latch back side portion 211 and the retaining pressure component 300 includes a retaining pressure component body 310. The latch back side portion 211 is rotatably assembled to the expansion card bracket frame 100 via a first shaft 510. The retaining pressure component body 310 includes a back side portion 311. The back side portion 311 is rotatably assembled to the latch component 200 near to the latch back side portion 211 via a second shaft 520. When the latch component 200 is in the upward ready position 290, the latch component 200 is perpendicular to the expansion card bracket frame 100 and the retaining pressure component 300 is in the standby position 390, a distance away and parallel to the expansion card bracket frame 100 and perpendicular to the latch component 200. When the latch component 200 is in the latched position 230, the latch component 200 is parallel to the expansion card bracket frame 100, the retaining pressure component 300 is flush and parallel to the expansion card bracket frame 100, and the retaining pressure component 300 is encompassed within the latch component 200.

As illustrated for the electronic component chassis 20, the retaining pressure component body 310 further includes a front side portion 312 opposite the back side portion 311. The retaining pressure component 300 further includes an elastic pressure contact component 320 disposed on the front side portion 312. The side of the retaining pressure component 300 pressing flush with the first bracket side 121 when the latch component 200 is in the latched position 230, is the front side portion 312 with the disposed elastic pressure contact component 320 thereon. Each arch of the elastic pressure contact component 32 corresponds to each of the at least one mount guide 700 of the bracket mount component 120. As illustrated for the electronic component chassis 20, a material of the elastic pressure contact component 320 includes at least one of a silicone material, or a rubber material, or any combination of the foregoing. When the elastic pressure contact component 320 presses flush with the first bracket side 121 from an exterior of the electronic component chassis 20 a reaction force is formed.

As illustrated for the electronic component chassis 20, the expansion card bracket mount panel 10 further includes a tension spring 400, the electronic component chassis 20 includes an opening 29, and the latch back side portion 211 includes at least one position latch 920. In the illustrated embodiments, the tension spring 400 may include a helical extension spring, or a device loaded in tension and able to exert a pulling force as well as store energy. The tension spring 400 includes a first connection end 410 and a second connection end 490. The opening 29 is configured for mounting of the expansion card bracket mount panel 10 therein and includes at least one position catch 910. The at least one position latch 920 corresponds to the at least one position catch 910. The first connection end 410 is assembled to the expansion card bracket frame 100 and the second connection end 490 is assembled near to the back side portion 311 of the retaining pressure component 300. A spring force is formed between the expansion card bracket frame 100 and the retaining pressure component 300. When the latch component 200 is in the upward ready position 290 a frictional force is formed between the at least one position catch 910 and the at least one position latch 920. The frictional force between the at least one position catch 910 and the at least one position latch 920 is greater than the spring force formed between the expansion card bracket frame 100 and the retaining pressure component 300, steadily holding the latch component 200 in the upward ready position 290 and the retaining pressure component 300 in the standby position 390.

As illustrated for the electronic component chassis 20, the latch component 200 further includes at least one retaining latch 620 opposite the latch back side portion 211, the second bracket side 122 of the bracket mount component 120 includes at least one catch 610 disposed thereon, the retaining pressure component body 310 further includes a pair of side catches 820, and the opening 29 further includes a pair of side latches 810. The at least one retaining latch 620 protrudes from a perimeter side edge of the latch component 200. The at least one catch 610 corresponds to the at least one retaining latch 620, for example, the at least one catch 610 is convex-shaped and the at least one retaining latch 620 is concave-shaped. The pair of side catches 820 is disposed on bottom opposing sides of the retaining pressure component body 310, perpendicular to the back side portion 311. The pair of side latches 810 protrude from opposing perimeter side edges of the opening 29 and correspond to the pair of side catches 820. When the latch component 200 is in the latched position 230, the at least one retaining latch 620 is latched to the at least one catch 610 and the pair of side latches 810 is latched to the pair of side catches 820. A contact force is formed via the at least one retaining latch 620 being latched to the at least one catch 610 and the pair of side latches 810 being latched to the pair of side catches 820, when the side of the retaining pressure component 300 presses flush with the first bracket side 121 from an exterior of the electronic component chassis 20.

The expansion card bracket mount panel 10 of FIG. 4 and FIGS. 1-3 are similar to the expansion card bracket mount panel 10 of the electronic component chassis 20, and thus may be best understood with reference thereto where like numerals designate like components not described again in detail. As illustrated for the electronic component chassis 20, the at least one expansion card bracket 30 includes a supporting base 32 and a mounting portion 36. The mounting portion 36 includes a bottom inner side 132 and a bottom outer side 131 opposite the bottom inner side 132. The at least one expansion card bracket 30 is mounted to the expansion card bracket frame 100 via at least the mounting portion 36. When the latch component 200 is in the latched position 230 and the retaining pressure component 300 is in the retaining position 330, the bottom inner side 132 is flush with the first bracket side 121, and the retaining pressure component 300 presses flush with the bottom outer side 131. As illustrated, the at least one expansion card bracket 30 includes a circuit board 34.

As illustrated for the electronic component chassis 20, the first bracket side 121 of the bracket mount component 120 further includes at least one mount guide 700 and a through hole 123, and the mounting portion 36 has a guide slot 38 corresponding to the at least one mount guide 700. The at least one mount guide 700 protrudes through the through hole 123. When the at least one expansion card bracket 30 is mounted to the expansion card bracket frame 100, the at least one mount guide 700 protrudes through the guide slot 38. As illustrated, the at least one expansion card bracket 30 further includes a guide end 39 opposite the mounting portion 36 and the electronic component chassis 20 further includes at least one expansion card bracket slot 22 corresponding to the guide end 39. When the at least one expansion card bracket 30 is mounted to the expansion card bracket frame 100, the at least one mount guide 700 protrudes through the guide slot 38 and the guide end 39 protrudes into the at least one expansion card bracket slot 22.

As illustrated for the electronic component chassis 20, the at least one expansion card bracket 30 includes eight expansion card brackets 30. As illustrated for the electronic component chassis 20, the at least one expansion card bracket 30 includes at least one of a peripheral component interconnect (PCI), an accelerated graphics port (AGP), or a PCI Express (PCIe), or any combination of the foregoing.

Figure 5:
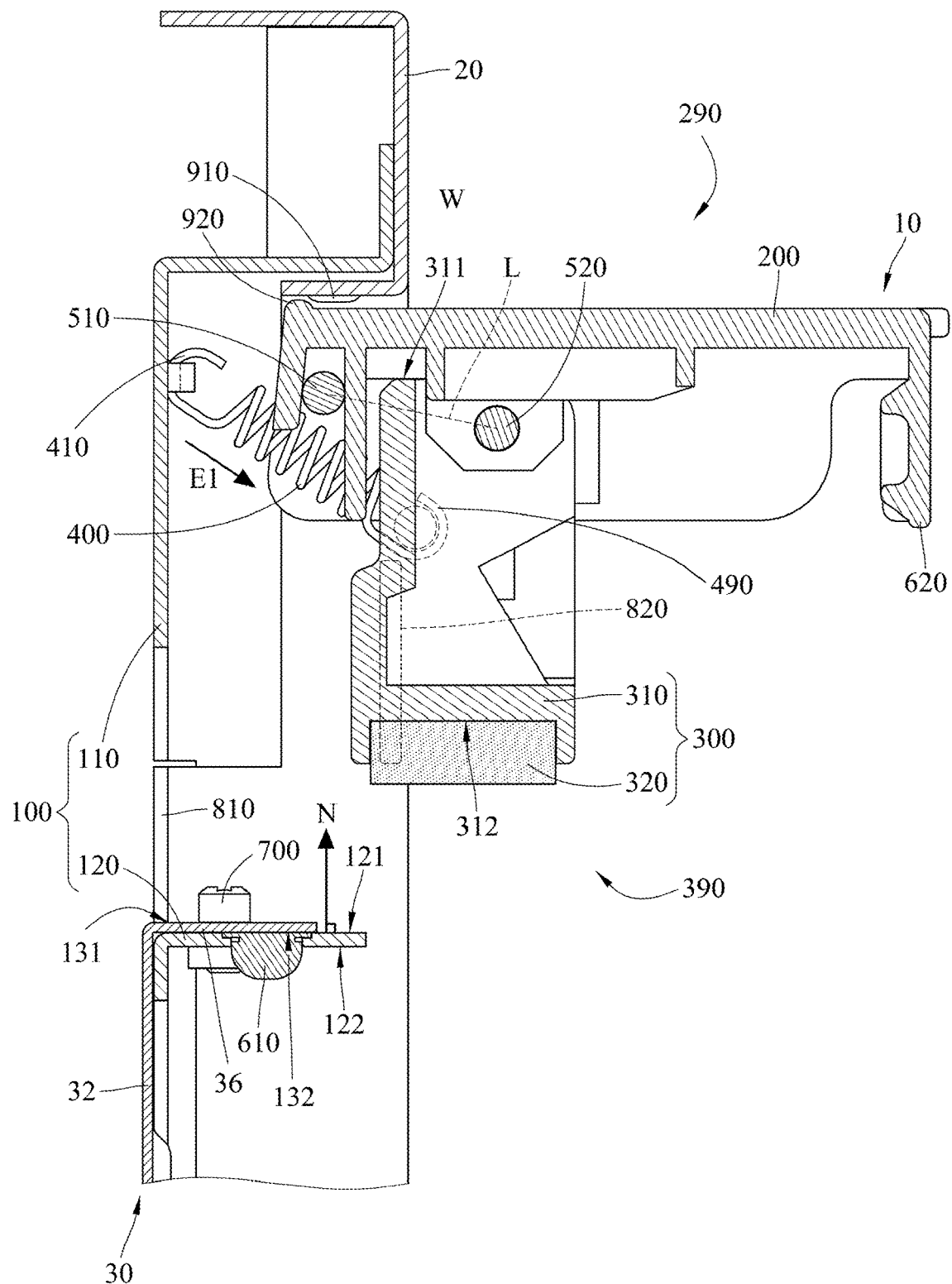
FIG. 5 illustrates a cross-section view of the expansion card bracket mount panel of FIG. 2, according to disclosed embodiments.
Figure 6:
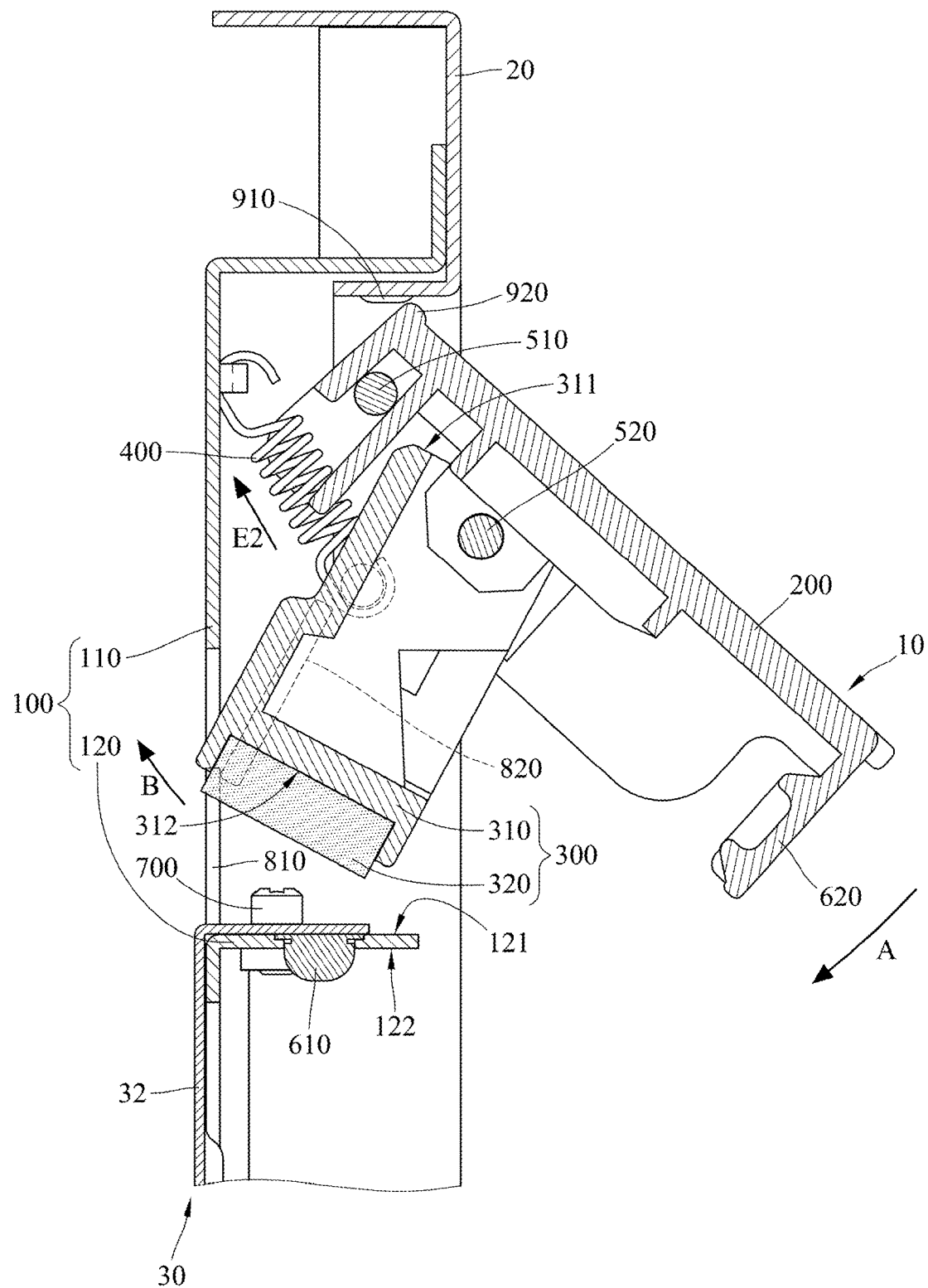
FIG. 6 illustrates a cross-section view of the expansion card bracket mount panel of FIGS. 5 and 8 in a moved position, according to disclosed embodiments.
Figure 7:
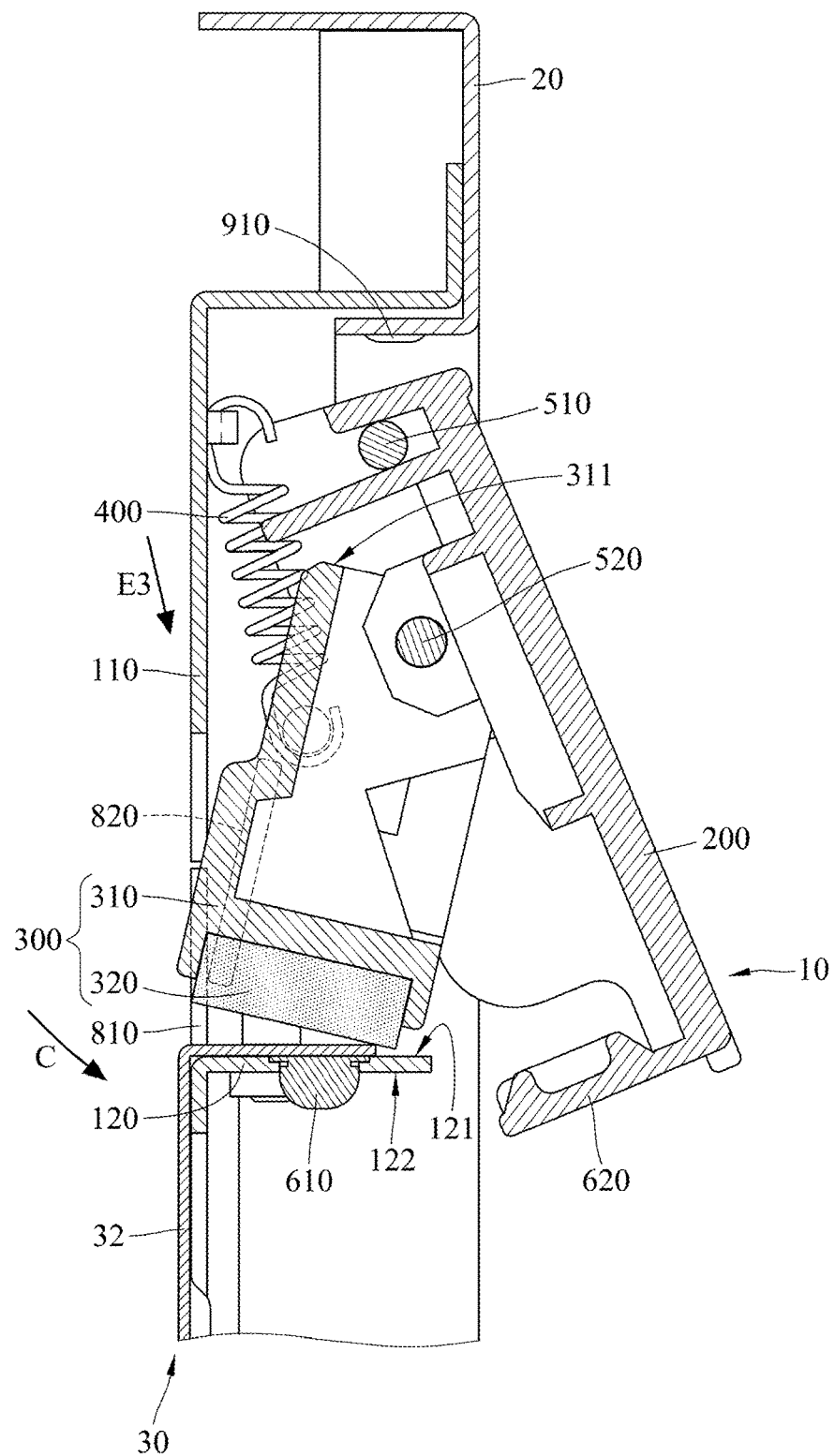
FIG. 7 illustrates another cross-section view of the expansion card bracket mount panel of FIGS. 5 and 8 in another moved position, according to disclosed embodiments.
Figure 8:
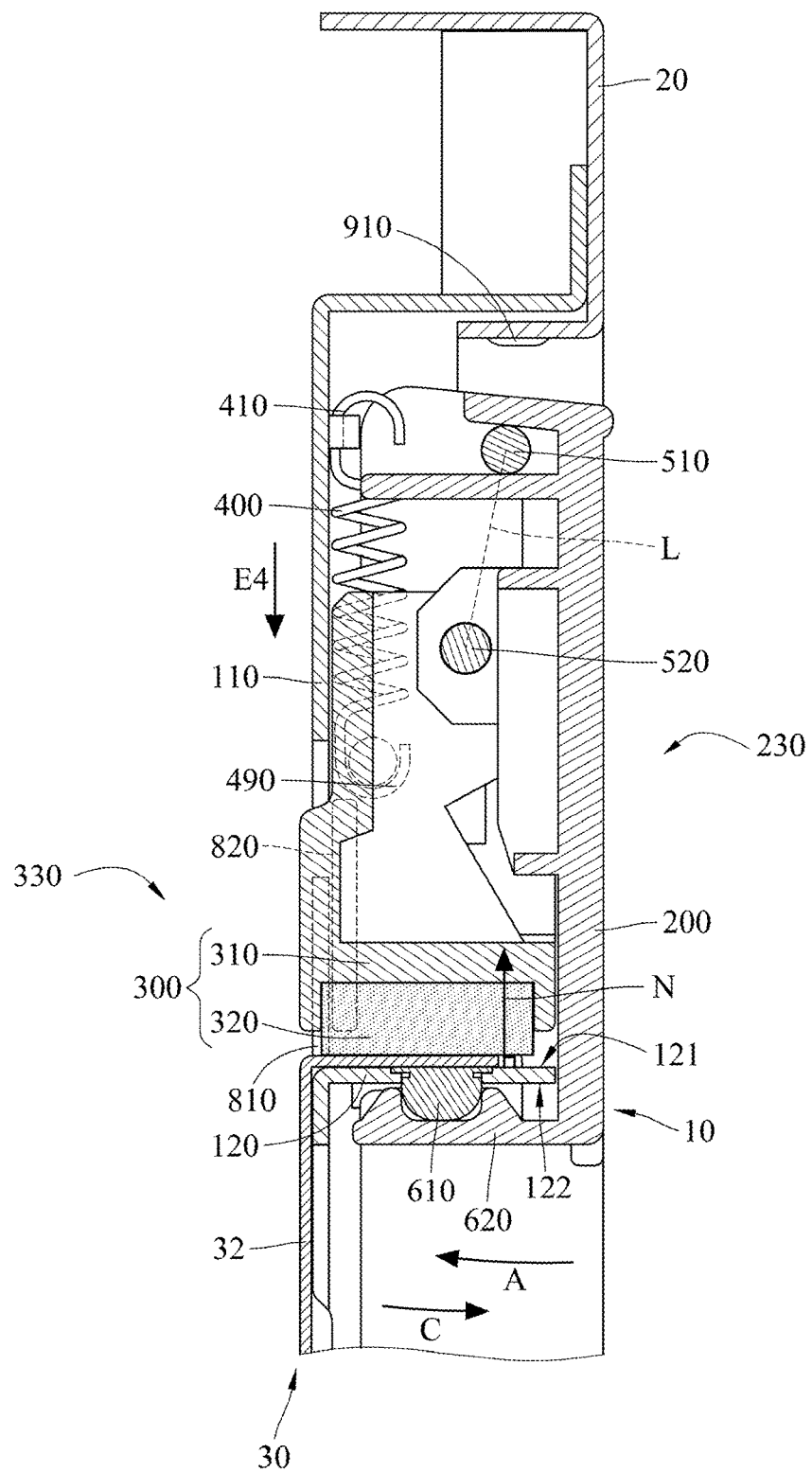
FIG. 8 illustrates a cross-section view of the expansion card bracket mount panel of FIG. 1, according to disclosed embodiments.

FIG. 5 illustrates a cross-section view of the expansion card bracket mount panel of FIG. 2, according to disclosed embodiments. FIG. 6 illustrates a cross-section view of the expansion card bracket mount panel of FIGS. 5 and 8 in a moved position, according to disclosed embodiments. FIG. 7 illustrates another cross-section view of the expansion card bracket mount panel of FIGS. 5 and 8 in another moved position, according to disclosed embodiments. FIG. 8 illustrates a cross-section view of the expansion card bracket mount panel of FIG. 1, according to disclosed embodiments. As illustrated in FIGS. 5-8, and as illustrated in FIGS. 1-4, the expansion card bracket mount panel 10 is configured to be mounted to the electronic component chassis 20 (partially shown) and for the at least one expansion card bracket 30 to be mounted thereto. The at least one expansion card bracket 30 may be a peripheral component interconnect (PCI) card, an accelerated graphics port (AGP) card, a PCI Express (PCIe) card, or any expansion card comprising a supporting base 32, a mounting portion 36 and a circuit board 34, which may be installed to, retained in, and extracted from an electronic component chassis 20. The electronic component system, may be a host, a server, a network switch, a computer, or any electronic component system requiring installation, retention, and extraction of the at least one expansion card bracket 30 therein.

As illustrated in FIG. 5, when a user is installing the at least one expansion card bracket 30, the latch component 200 is in the upward ready position 290, perpendicular to the expansion card bracket frame 100, and the retaining pressure component 300 is in the standby position 390, a distance away and parallel to the expansion card bracket frame 100 and perpendicular to the latch component 200. Operation of retaining the at least one expansion card bracket 30 to the electronic component system is from the exterior side 130 of the expansion card bracket frame 100, and thus, exterior side of the electronic component chassis 20 of the electronic component system. When the latch component 200 is in the upward ready position 290 a frictional force is formed between the at least one position catch 910 and the at least one position latch 920. A tension spring force is formed between the expansion card bracket frame 100 and the retaining pressure component 300, whereby the tension spring is in an extended ready direction E1. The frictional force between the at least one position catch 910 and the at least one position latch 920 is greater than the spring force formed between the expansion card bracket frame 100 and the retaining pressure component 300. The latch component 200 is steadily held in the upward ready position 290 and the retaining pressure component 300 is steadily held in the standby position 390.

Next, a dust cover may be removed from the expansion card bracket mount panel 10. Once the dust cover is removed, the at least one expansion card bracket 30 is aligned with a compatible slot (not shown), leveled, and gently but firmly inserted into the slot. When inserted into the slot, the at least one mount guide 700 protrudes through the guide slot 38 and the guide end 39 protrudes into the at least one expansion card bracket slot 22. Following, the at least one expansion card bracket 30 is retained to the expansion card bracket mount panel 10 mounted to the electronic component chassis 20 to prevent the at least one expansion card bracket 30 from inadvertently detaching from the slot.

As illustrated in FIG. 6, when the latch component 200 is rotated downward (A direction) toward the expansion card bracket frame 100 the frictional force between the at least one position catch 910 and the at least one position latch 920 is overcome and the spring force formed between the expansion card bracket frame 100 and the retaining pressure component 300 is lessened, whereby the tension spring moves in a retracted operational direction E2 to drive the retaining pressure component 300 to rotate downward (B direction) and forward, angled to the expansion card bracket frame 100 and angled to the latch component 200. As illustrated in FIG. 7, as the latch component 200 continues to rotate downward toward the expansion card bracket frame 100 the spring force formed between the expansion card bracket frame 100 and the retaining pressure component 300 increases, whereby the tension spring moves in an extended operational direction E3. The retaining pressure component 300 continues to rotate forward (C direction), decreasing an angle to the expansion card bracket frame 100 and decreasing an angle to the latch component 200. As illustrated, elastic pressure contact component 320 of the retaining pressure component 300 begins to contact the bottom outer side 131 of the at least one expansion card bracket 30.

As illustrated in FIG. 8, the at least one expansion card bracket 30 is retained to the expansion card bracket mount panel 10 mounted to the electronic component chassis 20, preventing the at least one expansion card bracket 30 from inadvertently detaching from the slot. It is noted that no tools, screws, or screwing is required for retention and disengagement of the at least one expansion card bracket 30 to the expansion card bracket mount panel 10 mounted to the electronic component chassis 20. It is also noted that retention and disengagement of the at least one expansion card bracket 30 to the expansion card bracket mount panel 10 mounted to the electronic component chassis 20 occurs from the exterior side 130 of the expansion card bracket frame 100, and thus, exterior side of the electronic component chassis 20 of the electronic component system.

When the latch component 200 continues to rotate downward (A direction) toward the expansion card bracket frame 100 to the latched position 230, the spring force formed between the expansion card bracket frame 100 and the retaining pressure component 300 further increases, whereby the tension spring further moves in an extended operational direction E4. When the latch component 200 is in the latched position 230, the latch component 200 is parallel to the expansion card bracket frame 100 and latched thereto. The retaining pressure component 300 continues to rotate forward (C direction), moving parallel to the expansion card bracket frame 100 and parallel to the latch component 200. As illustrated, the retaining pressure component 300 is gradually forced to be encompassed within the latch component 200 via initial resistance between the pair of side catches 820 and the pair of side latches 810. The retaining pressure component 300 is eventually encompassed within the latch component 200. The at least one retaining latch 620 is latched to the at least one catch 610 and the pair of side latches 810 is latched to the pair of side catches 820. The elastic pressure contact component 320 of the retaining pressure component 300 is gradually forced to press flush with the bottom outer side 131 of the at least one expansion card bracket 30 via initial resistance between the pair of side catches 820 and the pair of side latches 810. The elastic pressure contact component 320 eventually presses flush with the bottom outer side 131 of the at least one expansion card bracket 30, whereby each arch of the elastic pressure contact component 32 corresponds to each of the at least one mount guide 700 of the bracket mount component 120.

In the illustrated embodiments, when the latch component 200 is in the latched position 230 and the retaining pressure component 300 is in the retaining position 330, a reaction force is formed between the elastic pressure contact component 320 and the bottom outer side 131 of the at least one expansion card bracket 30 upon deformation of the at least one expansion card bracket 30. The reaction force is sufficient to retain the at least one expansion card bracket 30 to the expansion card bracket mount panel 10 mounted to the electronic component chassis 20 to prevent the at least one expansion card bracket 30 from inadvertently detaching from the slot.

In the illustrated embodiments, when the latch component 200 is in the latched position 230 and the retaining pressure component 300 is in the retaining position 330, a contact force is formed between the elastic pressure contact component 320 and the bottom outer side 131 of the at least one expansion card bracket 30. The contact force is formed via the at least one retaining latch 620 being latched to the at least one catch 610 and the pair of side latches 810 being latched to the pair of side catches 820. The contact force is sufficient to retain the at least one expansion card bracket 30 to the expansion card bracket mount panel 10 mounted to the electronic component chassis 20 to prevent the at least one expansion card bracket 30 from inadvertently detaching from the slot.

In the illustrated embodiments, when the latch component 200 is in the latched position 230 and the retaining pressure component 300 is in the retaining position 330, a contact force is formed between the elastic pressure contact component 320 and the bottom outer side 131 of the at least one expansion card bracket 30. The contact force if formed via the tension spring 400, having the first connection end 410 assembled to the expansion card bracket frame 100 and the second connection end 490 assembled near to the back side portion 311 of the retaining pressure component 300, being parallel to the expansion card bracket frame 100 and the second shaft 520 being positioned closer to an exterior bottom of the expansion card bracket frame 100 than the first shaft 510, and closer to the first bracket side 121 than the first shaft 510. An angle L from a cross-section side view is formed, from the center of the first shaft 510 to the center of the second shaft 520, in relation to a longitudinal direction N of the expansion card bracket frame 100. The angle L is toward the exterior bottom of the expansion card bracket frame 100, steadily holding the latch component 200 in the latched position 230 and the retaining pressure component 300 in the retaining position 330. The contact force is sufficient to retain the at least one expansion card bracket 30 to the expansion card bracket mount panel 10 mounted to the electronic component chassis 20 to prevent the at least one expansion card bracket 30 from inadvertently detaching from the slot.

In the illustrated embodiments, the latching component 200 include at least one of a plastic material, or a metal material, or any combination of the foregoing. In the illustrated embodiments, the retaining pressure component 300 include at least one of a plastic material, or a metal material, or any combination of the foregoing.

In the illustrated embodiments, the at least one mount guide 700 of the first bracket side 121 of the bracket mount component 120 may be disposed on the first bracket side 121 of the bracket mount component 120 by screwing. However, the illustrated embodiments are not limited thereto. In further illustrated embodiments, the at least one mount guide 700 may be disposed on the first bracket side 121 of the bracket mount component 120 by riveting, welding, press fit joining, or snap fit joining, etc.

In the illustrated embodiments, the at least one mount guide 700 may include eight mount guides 700. However, the illustrated embodiments are not limited thereto. In further illustrated embodiments, the at least one mount guide 700 may include less than or more than eight mount guides 700.

In the illustrated embodiments, the at least one catch 610 may be disposed on the second bracket side 122 of the bracket mount component 120 by riveting. However, the illustrated embodiments are not limited thereto. In further illustrated embodiments, the at least one catch 610 may be disposed on the second bracket side 122 of the bracket mount component 120 by screwing, stamping, or snap fit joining, etc.

An expansion card bracket mount panel 10 including an expansion card bracket frame 100 having an interior side 190, exterior side 130, and bracket mount component 120 disposed on the interior side 190, latch component 200 having at least one retaining latch 620, and retaining pressure component 300 having an elastic pressure contact component 320 is provided. The latch component 200 is rotatably assembled to the exterior side 130 of the expansion card bracket frame 100 having an upward ready position 290 and latched position 230 and the retaining pressure component 300 is rotatably assembled to the latch component 200 having a standby position 390 and retaining position 330. When the latch component 200 is in the latched position 230, the latch component 200 is latched to the expansion card bracket frame 100 and a side of the elastic pressure contact component 320 presses flush with the bracket mount component 120 forming a contact force. A reaction force is formed when the elastic pressure contact component 320 deforms when pressed flush with the bracket mount component 120.

In the illustrated embodiments, a reaction force is formed between the elastic pressure contact component 320 and the bottom outer side 131 of the at least one expansion card bracket 30 upon deformation of the at least one expansion card bracket 30 when the latch component 200 is in the latched position 230 and the retaining pressure component 300 is in the retaining position 330. The reaction force is sufficient to retain the at least one expansion card bracket 30 to the expansion card bracket mount panel 10 mounted to the electronic component chassis 20.

In the illustrated embodiments, a contact force is formed between the elastic pressure contact component 320 and the bottom outer side 131 of the at least one expansion card bracket 30 when the latch component 200 is in the latched position 230 and the retaining pressure component 300 is in the retaining position 330. The contact force is formed via the at least one retaining latch 620 being latched to the at least one catch 610 and the pair of side latches 810 being latched to the pair of side catches 820. The contact force is sufficient to retain the at least one expansion card bracket 30 to the expansion card bracket mount panel 10 mounted to the electronic component chassis 20.

In the illustrated embodiments, a contact force is formed between the elastic pressure contact component 320 and the bottom outer side 131 of the at least one expansion card bracket 30 when the latch component 200 is in the latched position 230 and the retaining pressure component 300 is in the retaining position 330. The contact force if formed via the tension spring 400, having the first connection end 410 assembled to the expansion card bracket frame 100 and the second connection end 490 assembled near to the back side portion 311 of the retaining pressure component 300, being parallel to the expansion card bracket frame 100 and the second shaft 520 being positioned closer to an exterior bottom of the expansion card bracket frame 100 than the first shaft 510, and closer to the first bracket side 121 than the first shaft 510. The angle L is toward the exterior bottom of the expansion card bracket frame 100, steadily holding the latch component 200 in the latched position 230 and the retaining pressure component 300 in the retaining position 330. The contact force is sufficient to retain the at least one expansion card bracket 30 to the expansion card bracket mount panel 10 mounted to the electronic component chassis 20.

In the illustrated embodiments, separate contact forces are achieved via the at least one retaining latch 620 being latched to the at least one catch 610 and the pair of side latches 810 being latched to the pair of side catches 820, and via the parallel tension spring 400 and the second shaft 520 being positioned closer to an exterior bottom of the expansion card bracket frame 100 than the first shaft 510, and closer to the first bracket side 121 than the first shaft 510. A reaction force is formed between the elastic pressure contact component 320 and the bottom outer side 131 of the at least one expansion card bracket 30 upon deformation of the at least one expansion card bracket 30. The reaction force, and contact forces, individually, are sufficient to retain the at least one expansion card bracket 30 to the expansion card bracket mount panel 10 mounted to the electronic component chassis 20, preventing the at least one expansion card bracket 30 from inadvertently detaching from the slot. As no tools, screws, or screwing is required for retention and disengagement of the at least one expansion card bracket 30 to the expansion card bracket mount panel 10 mounted to the electronic component chassis 20, time is saved as manual extraction of dust covers and screws and insertion of the expansion cards and screws, individually, is not required. Additionally, for example, during sudden failure of the expansion cards and crash of the electronic component system, no tool is required for extraction and insertion of the expansion cards, making extraction and insertion more convenient. Furthermore, as retention and disengagement of the at least one expansion card bracket 30 to the expansion card bracket mount panel 10 mounted to the electronic component chassis 20 occurs from the exterior side 130 of the expansion card bracket frame 100, and thus, exterior side of the electronic component chassis 20 of the electronic component system, retention of the expansion cards to the electronic component chassis in the inside of the electronic component system is simplified as navigation with other electronic components is not required. Additionally, with no tools, screws, or screwing, manipulation of the screw which is small, which may be easily dropped, lost, or stuck in the components of the electronic component system is not required. The wear and tear on the screw threads and/or chassis threads from the unscrewing and screwing of the dust covers and expansion cards over time, causing failure thereto, such as stripped threading, resulting in the expansion cards being inadvertently moved, detached and/or damaged, causing the electronic component system to crash and fail is no longer a concern.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those of ordinary skill in the relevant art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

What is claimed is:

1. An expansion card bracket mount panel, configured to be mounted to an electronic component chassis, comprising: an expansion card bracket frame, configured for mounting to the electronic component chassis and configured for at least one expansion card bracket to be mounted to the expansion card bracket frame, the expansion card bracket frame including an interior side, an exterior side opposite the interior side, and a bracket mount component disposed on the interior side, the bracket mount component including a first bracket side and a second bracket side opposite the first bracket side; a latch component, rotatably assembled to the expansion card bracket frame on the exterior side, having an upward ready position and a latched position; and a retaining pressure component, rotatably assembled to the latch component, having a standby position and a retaining position, wherein when the latch component is in the latched position, the latch component is latched to the expansion card bracket frame and the retaining pressure component is in the retaining position, whereby a side of the retaining pressure component presses flush with the first bracket side; and the latch component comprises a latch back side portion, the latch back side portion is rotatably assembled to the expansion card bracket frame via a first shaft, and wherein the retaining pressure component comprises a retaining pressure component body comprising a back side portion, the back side portion is rotatably assembled to the latch component near to the latch back side portion via a second shaft, whereby when the latch component is in the 8 upward ready position, the latch component is perpendicular to the expansion 9 card bracket frame and the retaining pressure component is in the standby position, a distance away from and parallel to the expansion card bracket frame and perpendicular to the latch component, and when the latch component is in the latched position, the latch component is parallel to the expansion card bracket frame, the retaining pressure component is flush with and parallel to the expansion card bracket frame, and the retaining pressure component is encompassed within the latch component.

2. The expansion card bracket mount panel of claim 1, wherein the retaining pressure component body further comprises a front side portion opposite the back side portion, and the retaining pressure component further comprises an elastic pressure contact component disposed on the front side portion, whereby the side of the retaining pressure component pressing flush with the first bracket side when the latch component is in the latched position, is the front side portion with the disposed elastic pressure contact component thereon, whereby the elastic pressure contact component has a reaction force when pressing flush with the first bracket side.

3. The expansion card bracket mount panel of claim 2, wherein a material of the elastic pressure contact component comprises at least one of a silicone material, or a rubber material, or any combination of the foregoing.

4. The expansion card bracket mount panel of claim 1, further comprising a tension spring comprising a first connection end and a second connection end, and wherein the electronic component chassis comprises an opening comprising at least one position catch, the opening configured for mounting of the expansion card bracket mount panel therein, and wherein the latch back side portion comprises at least one position latch corresponding to the at least one position catch, wherein the first connection end is assembled to the expansion card bracket frame and the second connection end is assembled near to the back side portion of the retaining pressure component forming a spring force therebetween, whereby when the latch component is in the upward ready position, a frictional force between the at least one position catch and the at least one position latch is greater than the spring force, holding the latch component steady in the upward ready position and the retaining pressure component steady in the standby position.

5. The expansion card bracket mount panel of claim 4, wherein the latch component further comprises at least one retaining latch opposite the latch back side, protruding from a perimeter side edge of the latch component, the second bracket side of the bracket mount component comprises at least one catch disposed thereon corresponding to the at least one retaining latch, the retaining pressure component body further comprises a pair of side catches disposed on bottom opposing sides of the retaining pressure component body, perpendicular to the back side portion, and the opening further comprises a pair of side latches, protruding from opposing perimeter side edges thereof corresponding to the pair of side catches, whereby when the latch component is in the latched position, the at least one retaining latch is latched to the at least one catch and the pair of side latches is latched to the pair of side catches, and whereby the side of the retaining pressure component pressing flush with the first bracket side has a contact force via the at least one retaining latch being latched to the at least one catch and the pair of side latches being latched to the pair of side catches.

6. The expansion card bracket mount panel of claim 1, wherein the at least one expansion card bracket comprises a supporting base and a mounting portion, the mounting portion comprises a bottom inner side and a bottom outer side opposite the bottom inner side, whereby the at least one expansion card bracket is mounted to the expansion card bracket frame via at least the mounting portion, and when the latch component is in the latched position and the retaining pressure component is in the retaining position, the bottom inner side is flush with the first bracket side, and the retaining pressure component presses flush with the bottom outer side.

7. The expansion card bracket mount panel of claim 6, wherein the first bracket side of the bracket mount component further comprises at least one mount guide protruding therefrom, and wherein the mounting portion has guide slot corresponding to the at least one mount guide, whereby when the at least one expansion card bracket is mounted to the expansion card bracket frame, the at least one mount guide protrudes through the guide slot.

8. The expansion card bracket mount panel of claim 1, wherein the at least one expansion card bracket comprises at least one of a peripheral component interconnect (PCI), an accelerated graphics port (AGP), or a PCI Express (PCIe), or any combination of the foregoing.

9. The expansion card bracket mount panel of claim 1, wherein the at least one expansion card bracket comprises eight expansion card brackets.

10. An electronic component chassis, comprising: an expansion card bracket mount panel, configured to be mounted to the electronic component chassis, comprising: an expansion card bracket frame, configured for mounting to the electronic component chassis and configured for at least one expansion card bracket to be mounted to the expansion card bracket frame, the expansion card bracket frame including an interior side, an exterior side opposite the interior side, and a bracket mount component disposed on the interior side, the bracket mount component including a first bracket side and a second bracket side opposite the first bracket side; a latch component, rotatably assembled to the expansion card bracket frame on the exterior side, having an upward ready position and a latched position; and a retaining pressure component, rotatably assembled to the latch component, having a standby position and a retaining position, wherein when the latch component is in the latched position, the latch component is latched to the expansion card bracket frame and the retaining pressure component is in the retaining position, whereby a side of the retaining pressure component presses flush with the first bracket side; and the latch component comprises a latch back side portion, the latch back side portion is rotatably assembled to the expansion card bracket frame via a first shaft, and wherein the retaining pressure component comprises a retaining pressure component body comprising a back side portion, the back side portion is rotatably assembled to the latch component near to the latch back side portion via a second shaft, whereby when the latch component is in the upward ready position, the latch component is perpendicular to the expansion card bracket frame and the retaining pressure component is in the standby position, a distance away from and parallel to the expansion card bracket frame and perpendicular to the latch component, and when the latch component is in the latched position, the latch component is parallel to the expansion card bracket frame, the retaining pressure component is flush with and parallel to the expansion card bracket frame, and the retaining pressure component is encompassed within the latch component.

11. The electronic component chassis of claim 10, wherein the retaining pressure component body further comprises a front side portion opposite the back side portion, and the retaining pressure component further comprises an elastic pressure contact component disposed on the front side portion, whereby the side of the retaining pressure component pressing flush with the first bracket side when the latch component is in the latched position, is the front side portion with the disposed elastic pressure contact component thereon, whereby the elastic pressure contact component has a reaction force when pressing flush with the first bracket side.

12. The expansion card bracket mount panel of claim 11, wherein a material of the elastic pressure contact component comprises at least one of a silicone material, or a rubber material, or any combination of the foregoing.

13. The electronic component chassis of claim 10, further comprising a tension spring comprising a first connection end and a second connection end, and wherein the electronic component chassis comprises an opening comprising at least one position catch, the opening configured for mounting of the expansion card bracket mount panel therein, and wherein the latch back side portion comprises at least one position latch corresponding to the at least one position catch, wherein the first connection end is assembled to the expansion card bracket frame and the second connection end is assembled near to the back side portion of the retaining pressure component forming a spring force therebetween, whereby when the latch component is in the upward ready position, a frictional force between the at least one position catch and the at least one position latch is greater than the spring force, holding the latch component steady in the upward ready position and the retaining pressure component steady in the standby position.

14. The electronic component chassis of claim 13, wherein the latch component further comprises at least one retaining latch opposite the latch back side, protruding from a perimeter side edge of the latch component, the second bracket side of the bracket mount component comprises at least one catch disposed thereon corresponding to the at least one retaining latch, the retaining pressure component body further comprises a pair of side catches disposed on bottom opposing sides of the retaining pressure component body, perpendicular to the back side portion, and the opening further comprises a pair of side latches, protruding from opposing perimeter side edges thereof corresponding to the pair of side catches, whereby when the latch component is in the latched position, the at least one retaining latch is latched to the at least one catch and the pair of side latches is latched to the pair of side catches, and whereby the side of the retaining pressure component pressing flush with the first bracket side has a contact force via the at least one retaining latch being latched to the at least one catch and the pair of side latches being latched to the pair of side catches.

15. The electronic component chassis of claim 10, wherein the at least one expansion card bracket comprises a supporting base and a mounting portion, the mounting portion comprises a bottom inner side and a bottom outer side opposite the bottom inner side, whereby the at least one expansion card bracket is mounted to the expansion card bracket frame via at least the mounting portion, and when the latch component is in the latched position and the retaining pressure component is in the retaining position, the bottom inner side is flush with the first bracket side, and the retaining pressure component presses flush with the bottom outer side.

16. The electronic component chassis of claim 15, wherein the first bracket side of the bracket mount component further comprises at least one mount guide protruding therefrom, and wherein the mounting portion has guide slot corresponding to the at least one mount guide, whereby when the at least one expansion card bracket is mounted to the expansion card bracket frame, the at least one mount guide protrudes through the guide slot.

17. The electronic component chassis of claim 10, wherein the at least one expansion card bracket comprises at least one of a peripheral component interconnect (PCI), an accelerated graphics port (AGP), or a PCI Express (PCIe), or any combination of the foregoing.

18. The electronic component chassis of claim 10, wherein the at least one expansion card bracket comprises eight expansion card bracket.

* * * * *